(12) United States Patent
Koga

(10) Patent No.: US 7,990,519 B2
(45) Date of Patent: Aug. 2, 2011

(54) EXPOSURE APPARATUS AND DEVICE MANUFACTURING METHOD

(75) Inventor: Shinichiro Koga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 12/371,482

(22) Filed: Feb. 13, 2009

(65) Prior Publication Data

US 2009/0208855 A1     Aug. 20, 2009

(30) Foreign Application Priority Data

Feb. 19, 2008    (JP) ................. 2008-037944

(51) Int. Cl.
     *G03B 27/52*      (2006.01)
     *G03B 27/42*      (2006.01)
(52) U.S. Cl. .................................. 355/55; 355/53
(58) Field of Classification Search .......... 355/52, 355/53, 55, 67; 356/399–401; 250/548
See application file for complete search history.

(56) References Cited

U.S. PATENT DOCUMENTS

| | | | |
|---|---|---|---|
| 5,986,766 A | 11/1999 | Koga et al. | |
| 6,400,441 B1 * | 6/2002 | Nishi et al. | 355/53 |
| 7,245,349 B2 * | 7/2007 | Sato | 355/53 |
| 7,313,873 B2 * | 1/2008 | Oishi et al. | 33/645 |
| 7,477,390 B2 * | 1/2009 | Koga | 356/401 |
| 7,701,553 B2 * | 4/2010 | Sasaki | 355/55 |
| 2006/0077388 A1 | 4/2006 | Koga | |
| 2009/0009738 A1 | 1/2009 | Sasaki | |

FOREIGN PATENT DOCUMENTS

| | | |
|---|---|---|
| JP | 9-218714 A | 8/1997 |
| JP | 2006-108582 A | 4/2006 |
| JP | 2007-184342 A | 7/2007 |
| JP | 2007-324159 A | 12/2007 |

\* cited by examiner

*Primary Examiner* — Hung Henry Nguyen
(74) *Attorney, Agent, or Firm* — Canon USA Inc. IP Division

(57) ABSTRACT

An exposure apparatus is configured to project a pattern of an original onto a substrate using a projection optical system, thereby exposing the substrate, and comprises a substrate stage configured to hold the substrate, a first detector configured to detect positions of marks on the substrate in a first direction and a second direction orthogonal to each other in a plane perpendicular to an optical-axis direction of the projection optical system, and a controller configured to control the first detector to detect the position of a mark on the substrate while moving the substrate stage substantially along the first direction, and control the first detector to detect the position of a mark on the substrate while moving the substrate stage substantially along the second direction, thereby controlling positioning and exposure of the substrate based on the detection results obtained by the first detector.

3 Claims, 12 Drawing Sheets

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate using a projection optical system, thereby exposing the substrate.

2. Description of the Related Art

In recent years, with advances in micropatterning and an increase in the packing density of semiconductor integrated circuit devices and liquid crystal panel devices, improvements in the accuracy and function of an exposure apparatus used in lithography for manufacturing these devices are in progress. A technique of positioning an original (also called a mask or reticle) and a substrate (a wafer or glass plate) on the order of nanometers for their alignment is expected to be available.

The exposure apparatus sequentially transfers the pattern of an original onto a plurality of shot regions on a substrate while moving the substrate step by step. An exposure apparatus which performs this transfer while the original and the substrate remain still is called a stepper. An exposure apparatus which performs this transfer while scanning the original and the substrate is called a scanner or a scanning stepper.

Recently, an exposure apparatus which mounts two substrate stages has been provided in order to meet two demands, namely, improvements in overlay accuracy and throughput. Such an exposure apparatus includes an exposure station for exposing a substrate, and a measurement station for measuring a substrate. While the exposure apparatus exposes a substrate in the exposure station, it measures a substrate to be exposed next in the measurement station. This makes it possible to improve the throughput while ensuring the substrate measurement time for improving the overlay accuracy (Japanese Patent Laid-Open No. 2006-108582).

The global alignment scheme is available as a substrate positioning method. FIG. 10 is a view illustrating the arrangement of shot regions on a substrate 5. As illustrated in FIG. 10, a plurality of shot regions ST formed by preprocessing are arranged on the substrate 5. The same patterns are generally formed in all shot regions. Also, alignment marks are set in all shot regions. The substrate can be positioned by selecting shot regions (measurement shot regions) to measure the positions of the alignment marks from all these shot regions, and measuring the positions of the alignment marks in the selected shot regions.

FIG. 11 is a view illustrating measurement shot regions. For example, the positions of the alignment marks in hatched measurement shots MS are measured in FIG. 11. The arrangement information of the shot regions on the substrate can be obtained by statistically calculating the measurement value of each alignment mark. In measuring the position of the alignment mark, it is moved to the field of a detecting system and kept still in this field. This operation is performed by selecting alignment marks in the order indicated by the arrows in FIG. 11. The arrows in FIG. 11 schematically show the state in which the field of the detecting system moves relative to the substrate. The alignment marks move in directions opposite to those indicated by the arrows relative to the field of the detecting system while the field of the detecting system is fixed in position.

FIG. 12 is a flowchart illustrating the sequence of substrate positioning (alignment) measurement (alignment measurement). Step S401 is a coarse alignment process of coarsely measuring the arrangement of the shot regions. In the coarse alignment process, shot regions fewer than those used in an alignment mark sensing process and alignment mark position calculation process (to be described hereinafter) are used as the measurement targets. In the coarse alignment process, the alignment marks are sensed and their positions are measured by a detecting system having a field larger than that of a detecting system used in the alignment mark sensing process. In the coarse alignment process, the alignment marks in, two shot regions are detected.

The substrate stage is driven based on the positions of the alignment marks measured in the coarse alignment process. Step S402 is a step driving process. In this process, the substrate stage is driven so that the alignment marks fall within the field of the detecting system based on the measurement result obtained in the coarse alignment process, and are kept still in this field. Step S403 is an alignment mark sensing process. In this process, the detecting system senses alignment mark images. Step S404 is an alignment mark position calculation process. In this process, the positions of the alignment marks are precisely detected based on the sensed alignment mark images. Steps S402 to S404 are repeated until it is determined in step S405 that the alignment marks in all measurement shot regions have been measured, and the measurement process is ended.

The global alignment scheme can obtain a high throughput and high accuracy. Moreover, the global alignment scheme is convenient because it allows alignment according to the same correction scheme throughout the entire substrate region (Japanese Patent Laid-Open No. 09-218714).

As demand for alignment accuracy is becoming stricter, even error components which are conventionally too small in amount to be problematic are becoming non-negligible. Under these circumstances a proposal has been made, which improves alignment accuracy by measuring a plurality of alignment marks in a measurement shot region to calculate not only the position of the shot region but also its shape, and correcting the shape of a shot region onto which a pattern is transferred. To calculate the shape of the shot region, from the viewpoint of the accuracy to measure the alignment marks on a plurality of scribe lines set in the periphery of the shot region.

The shot magnification representing the shape of the shot region is calculated. Assuming that (two) alignment marks set on one scribe line are measured, the shot magnification can be calculated along the direction of the scribe line, but cannot be calculated in a direction perpendicular to the scribe line. This makes it necessary to use a method of estimating the shot magnification in a direction perpendicular to the scribe line from that along the scribe line. If the alignment marks on scribe lines in two orthogonal directions are measured, the shot magnifications in these two directions can be calculated.

Increasing the number of alignment marks to be measured, in turn, increases the number of driving operations of the substrate stage and the number of times it must be kept still in the field of the detecting system, which is necessary for alignment mark measurement. Therefore, the resulting measurement processing time may adversely affect the overall throughput in an exposure apparatus which mounts two substrate stages as described above.

SUMMARY OF THE INVENTION

An aspect of the present invention provides a technique to suppress an increase in the time required for measurement when the number of measurements is increased.

There is provided an exposure apparatus which projects a pattern of an original onto a substrate using a projection optical system, thereby exposing the substrate. The apparatus includes a substrate stage configured to hold the substrate, a first detector configured to detect positions of marks on the substrate in a first direction and a second direction orthogonal to each other in a plane perpendicular to an optical-axis direction of the projection optical system, and a controller configured to control the first detector to detect the position of a mark on the substrate while moving the substrate stage substantially along the first direction, and control the first detector to detect the position of a mark on the substrate while moving the substrate stage substantially along the second direction, thereby controlling positioning and exposure of the substrate based on the detection results obtained by the first detector.

According to another aspect of the present invention, there is provided an exposure apparatus which projects a pattern of an original onto a substrate using a projection optical system, thereby exposing the substrate. The apparatus includes a substrate stage configured to hold the substrate, a first detector configured to detect positions of marks on the substrate in a first direction and a second direction orthogonal to each other in a plane perpendicular to an optical-axis direction of the projection optical system, a second detector configured to detect a surface position of the substrate in the optical-axis direction, and a controller configured to control the second detector to execute position detection while moving the substrate stage which holds the substrate on the plane perpendicular to the optical axis, and control the first detector to execute the position detection while controlling the surface position of the substrate in the optical-axis direction based on the detection result obtained by the second detector, thereby controlling positioning and exposure of the substrate based on the detection results obtained by the first detector and the second detector.

Further features of the present invention will become apparent from the following description of exemplary embodiments with reference to the attached drawings.

DESCRIPTION OF THE EMBODIMENTS

Various embodiments of the present invention will be described below with reference to the accompanying drawings.

Figure 2:
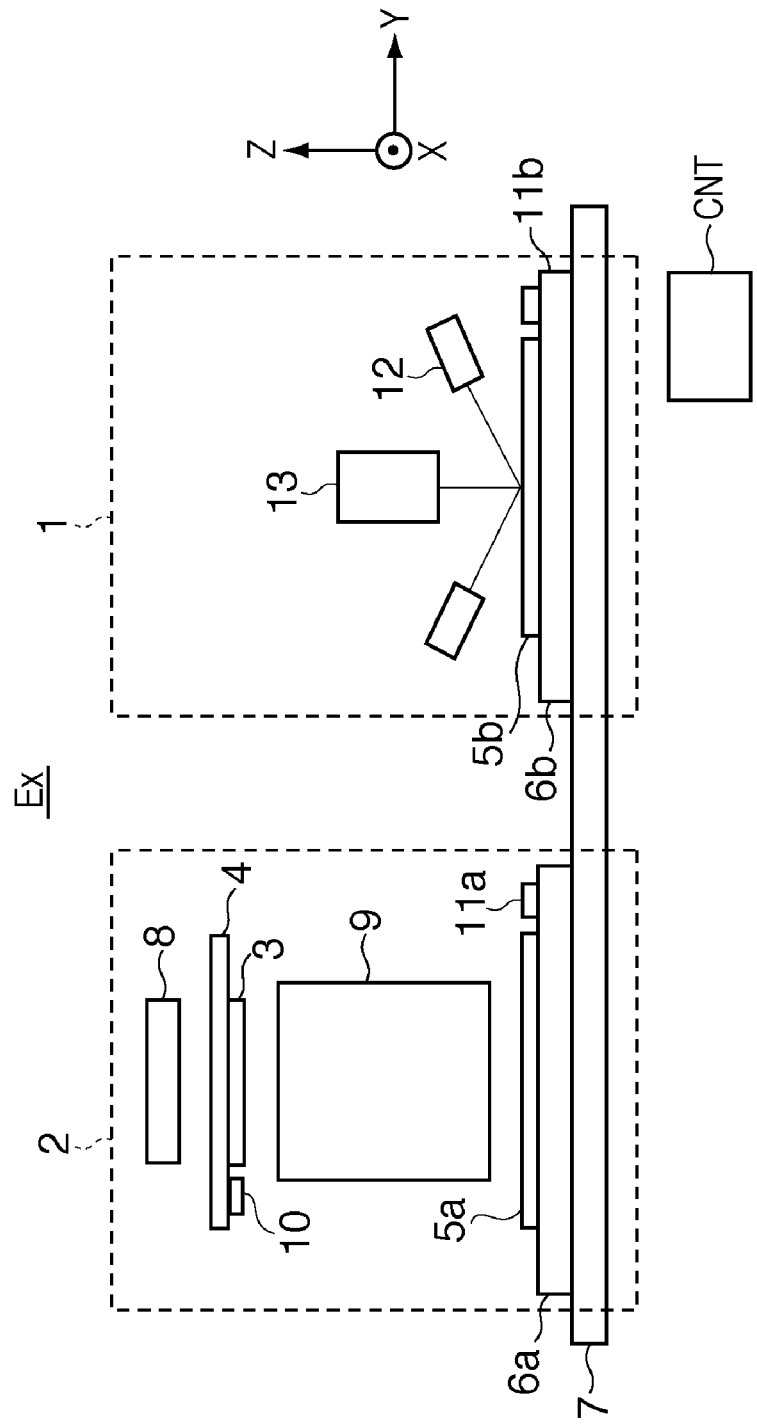
FIG. 2 is a view showing the schematic arrangement of an exposure apparatus according to a preferred embodiment of the present invention.

FIG. 2 is a view showing the schematic arrangement of an exposure apparatus according to a first embodiment of the present invention. An exposure apparatus EX according to the embodiment of the present invention includes a measurement station 1 and exposure station 2. Note that the exposure apparatus EX explained herein is merely one embodiment, and the present invention is also applicable to an exposure apparatus having a measurement station 1 and exposure station 2 integrated therein. Note also that although a scanning exposure apparatus which exposes a substrate while scanning it will be exemplified as the exposure apparatus EX, the exposure apparatus according to the present invention may be an exposure apparatus which exposes a substrate while it remains still (stepper).

The exposure station 2 includes an original stage (reticle stage) 4 for holding an original (reticle) 3, an illumination optical system 8 for illuminating the original 3 with exposure light, and a projection optical system 9 for projecting the pattern of the original 3 illuminated with the exposure light onto substrates (wafers) 5, 5a and 5b.

The exposure apparatus EX includes two substrate stages (wafer stages) 6, 6a and 6b which can move between the two stations 1 and 2. The substrate stages 6, 6a and 6b are supported by a stage surface plate 7. While a substrate (first substrate) held by one substrate stage is exposed in the exposure station 2, a substrate (second substrate) held by the other substrate stage is measured in the measurement station 1. When the exposure of the first substrate and the measurement of the second substrate are ended, the positions of the two substrate stages are swapped so that the measured second substrate is conveyed to the exposure station 2, and the exposed first substrate is conveyed to a device for the next process (typically, a developing device). In place of the first substrate, a new substrate (third substrate) provided to the substrate stage is measured in the measurement station 1. The exposure apparatus EX executes measurement and exposure simultaneously, in the manner described above. The number of substrate stages may be one or three or more.

A direction parallel to the optical axis of the projection optical system 9 is defined as the Z direction, and two orthogonal directions in a plane perpendicular to the Z direction are defined as the X and Y directions. In other words, the direction is defined based on the X-Y-Z coordinate system. The scanning direction of the original 3 and substrate 5 is assumed as the Y direction. In addition, the rotation directions about the X-, Y-, and Z-axes are assumed as the θX, θY, and θZ directions, respectively. A first direction and second direction described in the scope of claims can be interpreted as the X direction and Y direction, respectively, or as the Y direction and X direction, respectively.

The original 3 is illuminated by the illumination optical system 8 with exposure light having a uniform illuminance distribution. The exposure light which emerges from the illumination optical system 8 can be light emitted by, a mercury lamp, KrF excimer laser, ArF excimer laser, $F_2$ laser, or EUV (Extreme Ultra Violet) light source. However, the exposure light is not particularly limited to these.

The original stage 4 can not only move two-dimensionally on a plane perpendicular to the optical axis of the projection optical system 9, on the X-Y plane, but also finely rotate in the θZ direction. The original stage 4 is driven by an original stage driving mechanism (not shown) such as a linear motor. A mirror is arranged on the original stage 4 to measure the position of the original stage 4 by a laser interferometer (not shown). The position of the original stage 4 (as a result, the original 3) on the X-Y plane and its rotation angle θZ are measured in real time by the laser interferometer, and the measurement results are sent to a controller CNT. The controller CNT controls the original stage driving mechanism to position the original 3 based on the measurement results obtained by the laser interferometer.

The projection optical system 9 projects the pattern of the original 3 onto the substrate 5 at a predetermined projection magnification β. With this operation, the substrate 5 is exposed. The projection optical system 9 includes a plurality of optical elements, which are typically supported by a metallic optical system barrel. The projection magnification β of the projection optical system 9 can be set to, for example, ¼ or ⅕.

The substrate stage 6 can include a Z stage including a substrate chuck for holding the substrate 5, an X-Y stage for supporting the Z stage, and a base for supporting the X-Y stage. The substrate stage 6 is driven by a substrate stage driving mechanism (not shown) such as a linear motor. The substrate stage driving mechanism is controlled by the controller CNT.

A mirror is arranged on the substrate stage 6 to measure the position of the substrate stage 6 using a laser interferometer (not shown). The position of the substrate stage 6 (as a result, the substrate 5) on the X-Y plane and its rotation angle θZ are measured in real time by the laser interferometer, and the measurement results are sent to the controller CNT. Likewise, the position of the substrate stage 6 in the Z direction and its rotation angles θX and θY are measured in real time by the laser interferometer, and the measurement results are sent to the controller CNT. The controller CNT controls the substrate stage driving mechanism based on the measurement results obtained by the laser interferometer to adjust the position of the substrate 5 in the X, Y, and Z directions and its rotation angles θX, θY, and θZ.

An original alignment detecting system is arranged near the original stage 4. The original alignment detecting system detects substrate stage reference marks 11, 11a and 1ib on the substrate stages 6 via an original stage reference mark 10 set on the original stage 4, and the projection optical system 9. The use of the original alignment detecting system allows alignment of the substrate stage reference marks 11 relative to the original stage reference mark 10.

The measurement station 1 includes an alignment detecting system (first detector) 13 for detecting the positions of the substrate 5 and substrate stage reference mark 11, and a focus detecting system (second detector) 12 for detecting the surface position information (the position information in the Z direction and the tilt information) of the substrate 5. The focus detecting system 12 includes a light-projecting system for projecting detection light onto the surface of the substrate 5, and a light-receiving system for receiving the light reflected by the substrate 5. The detection result (measurement value) obtained by the focus detecting system 12 is sent to the controller CNT. The controller CNT drives the Z stage based on the detection result obtained by the focus detecting system 12, and adjusts the position in the Z direction (focus position) and the tilt angle of the substrate 5 held by the Z stage. The position detection results (measurement values) of the substrate 5 and substrate stage reference mark 11 obtained by the alignment detecting system 13 are sent to the controller CNT as pieces of positioning information.

The substrate stage reference mark 11 is set nearly flush with the surface of the substrate 5, and used for the position detection by the original alignment detecting system and the alignment detecting system 13. Also, the substrate stage reference mark 11 has a flat surface portion and therefore serves as the reference plane of the focus detecting system 12. Substrate stage reference marks 11 may be set at a plurality of corners of the substrate stage 6.

Figure 4:
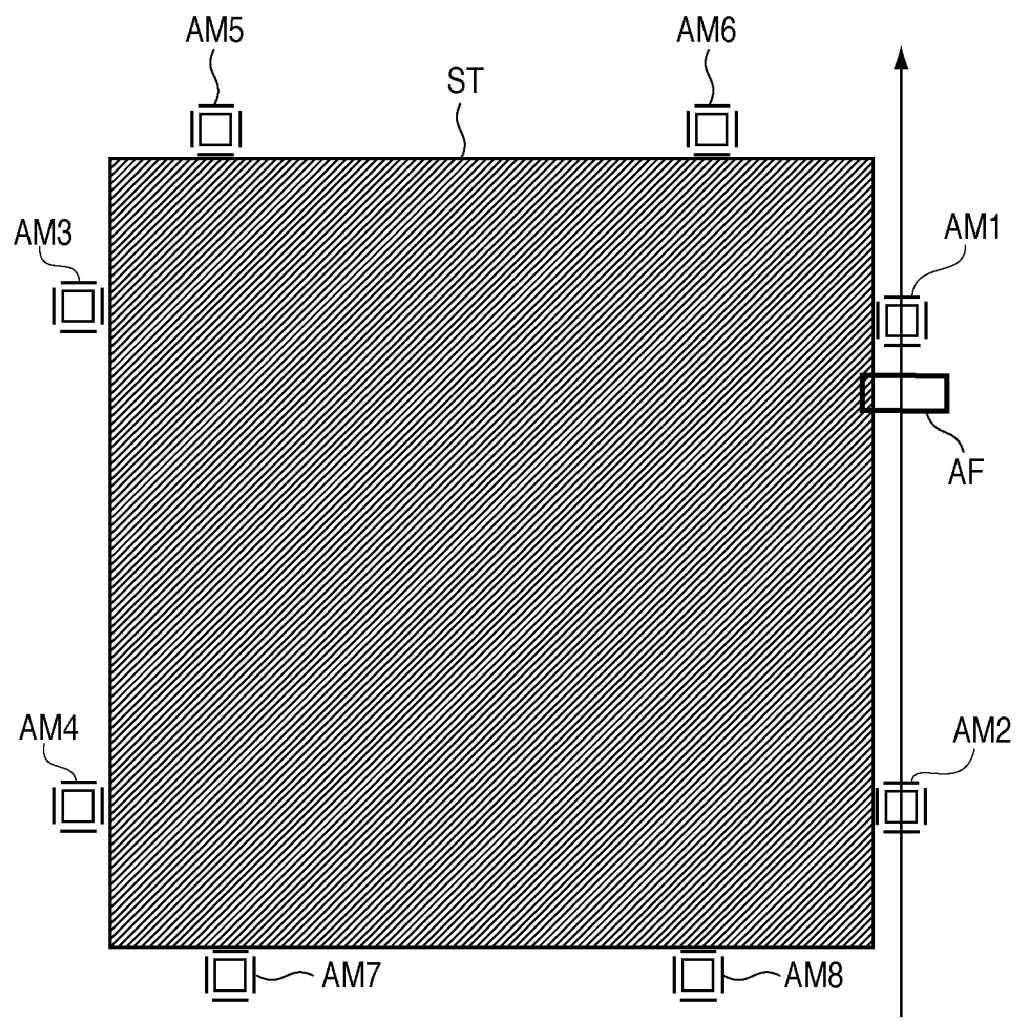
FIG. 4 is a view showing an example of the arrangement of alignment marks.

As illustrated in FIG. 4, the substrate 5 includes a plurality of alignment marks (to be referred to as marks hereinafter) AM1 to AM8 whose positions are detected by the alignment detecting system 13. A plurality of alignment marks of this role are set in the periphery of each shot region on the substrate 5, and the positional relationship between the alignment marks and the shot region in the X and Y directions is known. Hence, the position of the shot region can be detected by detecting the positions of the alignment marks.

The operation of the exposure apparatus EX will be explained below. After a substrate 5 is loaded into the measurement station 1, the substrate stage reference mark 11 is detected by the alignment detecting system 13. To implement this operation, the controller CNT moves the X-Y stage while monitoring the output from the laser interferometer so that the substrate stage reference mark 11 falls within the field of the alignment detecting system 13. With this operation, the alignment detecting system 13 detects the position information of the substrate stage reference mark 11 on the coordinate system defined by the laser interferometer. In the measurement station 1, the focus detecting system 12 detects the surface position information of the substrate stage reference mark 11.

The positions of a plurality of shot regions defined on the substrate 5 are detected. The controller CNT moves the X-Y stage while monitoring the output from the laser interferometer so that the alignment marks set in the periphery (scribe lines) of each shot region on the substrate 5 pass through the field of the alignment detecting system 13. In the process of the movement, the alignment detecting system 13 detects the positions of a plurality of alignment marks formed in the periphery of the shot region on the substrate 5. This operation is repeated on a plurality of scribe lines extending along the X and Y directions, thereby detecting the selected alignment marks. With this operation, the position of each alignment mark on the coordinate system defined by the laser interferometer is detected. Details of the alignment mark measurement will be described later.

Based on the detection results of the substrate stage reference mark 11 and each alignment mark obtained by the alignment detecting system 13, the positional relationship between the substrate stage reference mark 11 and each alignment mark is obtained. Because the positional relationship between each alignment mark and each shot region is known, that between the substrate stage reference mark 11 and each shot region on the substrate 5 on the X-Y plane can also be determined.

The focus detecting system 12 detects the pieces of surface position information of the substrate 5 in all shot regions on the substrate 5. The detection results are associated with the positions in the X and Y directions on the coordinate system defined by the laser interferometer, and are stored in the controller CNT.

Based on the detection results of the surface position information of the substrate stage reference mark 11 and that of each shot region on the substrate 5 obtained by the focus detecting system 12, the positional relationship between the surfaces of a substrate stage reference plate 14 and each shot region is determined.

The substrate is exposed in the exposure station 2 based on the measurement results of the substrate 5 obtained in the measurement station 1.

The controller CNT moves the X-Y stage so that the substrate stage reference mark 11 falls within the field of the original alignment detecting system. The original alignment detecting system detects the substrate stage reference mark 11 via the original stage reference mark 10 and projection optical system 9. That is, the positional relationship between the original stage reference mark 10 and the substrate stage reference mark 11 in the X and Y directions, and that in the Z direction are detected via the projection optical system 9. With this operation, the image position of the original pattern projected onto the substrate by the projection optical system 9 is detected using the substrate stage reference mark 11.

As the image position of the original pattern formed by the projection optical system 9 is detected, the controller CNT moves the X-Y stage to expose each shot region on the substrate 5. Using the measurement results obtained in the measurement station 1, each shot region is scanned and exposed. In the exposure of each shot region, the controller CNT controls alignment between the original 3 and each shot region on the substrate 5, based on the information (the positional relationship between the substrate stage reference mark 11 and each shot region) obtained in the measurement station 1 and the information (the positional relationship between the substrate stage reference mark 11 and an image of the original pattern) obtained in the exposure station 2.

The controller CNT also controls the surface position of the substrate 5 to align the surface of the substrate 5 with the image plane of the projection optical system 9 during the scanning exposure. This control is performed based on the positional relationship between the surfaces of the substrate stage reference mark 11 and substrate 5 obtained in the measurement station 1, and that between the surface of the substrate stage reference mark 11 and the image plane of the original pattern formed by the projection optical system 9, which is obtained in the exposure station 2.

Figure 3:
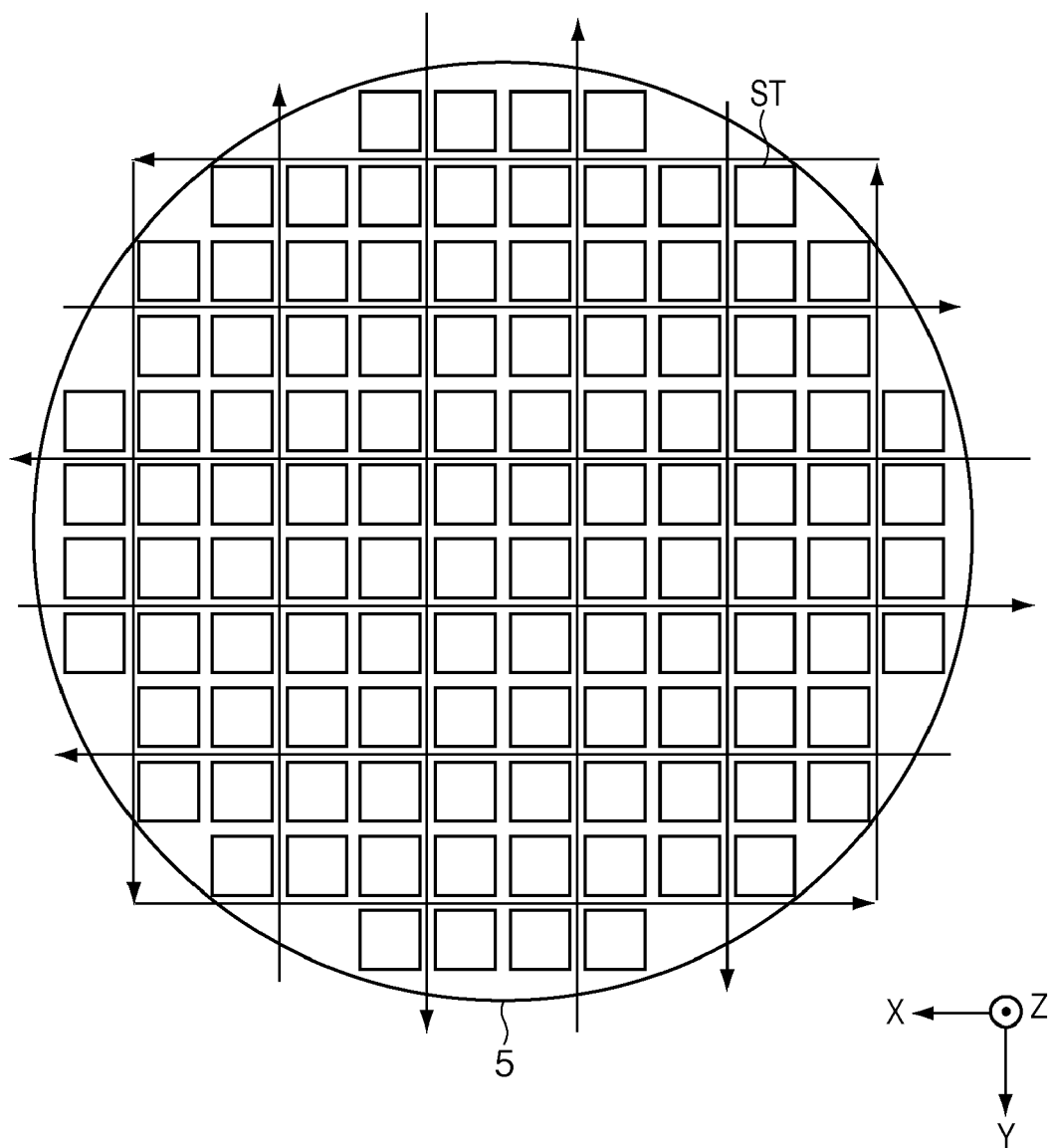
FIG. 3 is a view schematically showing an alignment mark measurement method.

Alignment mark measurement according to this embodiment will be explained in detail next. FIG. 3 is a view schematically showing an alignment mark measurement method. FIG. 4 is a view schematically showing a shot region ST on the substrate 5, alignment marks AM1 to AM8, and a field AF of the alignment detecting system 13 during the movement of the substrate stage 6. As described above, a plurality of shot regions ST are arranged on the substrate 5, and alignment marks are set in the periphery (scribe lines) of each shot region.

In this embodiment, the alignment detecting system 13 detects the positions of a plurality of alignment marks while moving the substrate stage 6 parallel to the X and Y directions in the arrangement of the shot regions. Note that the alignment detecting system 13 includes an image sensor. The image sensor senses the alignment marks and processes the obtained images, thereby detecting the positions of the alignment marks in the field of the alignment detecting system 13.

The alignment marks include, for example, a mark group (the marks AM5, AM6, AM7, and AM8 in FIG. 4) set on scribe lines almost along the X direction, and a mark group (the marks AM1, AM2, AM3, and AM4 in FIG. 4) set on scribe lines almost along the Y direction. "Almost" is used herein in consideration of the fact that the directions of the scribe lines may not be exactly parallel to the X or Y direction in practice due to deformation of the shot regions or their arrangement.

For the sake of convenience, the former group can be referred to as a first mark group, and the latter group can be referred to as a second group. In addition, the X direction can be referred to as a first direction, and the Y direction can be referred to as a second direction. Under this definition, the controller CNT controls the alignment detecting system (first detector) 13 to detect the first mark group while moving the substrate stage 6 almost along the first direction. The controller CNT also controls the alignment detecting system 13 to detect the position of each mark in the second mark group while moving the substrate stage 6 almost along the second direction. The controller CNT changes the position of the substrate stage 6 in the second direction and controls the alignment detecting system 13 to execute the position detection while moving the substrate stage 6 almost along the first direction for every change of that position. The controller CNT also changes the position of the substrate stage 6 in the first direction and controls the alignment detecting system 13 to execute the position direction while moving the alignment detecting system 13 almost along the second direction for every change of that position.

The measurement method can detect the positions of a plurality of alignment marks corresponding to a plurality of shot regions in contact with a scribe line (for example, all shot regions in contact with a scribe line) while moving the substrate stage 6.

Note that the arrows in FIGS. 3 and 4 schematically show the state in which the field of the alignment detecting system 13 moves relative to the substrate. In practice, the substrate, that is, the alignment marks move in directions opposite to those indicated by the arrows while the alignment detecting system 13 is fixed in position.

To meet demand for improving the alignment accuracy, it is necessary to increase not only the number of measurement shot regions but also the number of measurement alignment marks in each measurement shot. It is preferable to measure the alignment marks on one scribe line and those on a plurality of scribe lines. Measuring the alignment marks on scribe lines in the same direction is insufficient to calculate the shape of each shot region. For example, when only the alignment marks on a scribe line along the Y direction in FIG. 3 are measured, only the alignment marks AM1 and AM2 (the alignment marks AM1 to AM4 when two scribe lines along the Y direction are measured) in FIG. 4 can be measured. In this case, it is impossible to measure a change in the shape of each shot region along the X direction. It is therefore preferable to measure the alignment marks set on scribe lines along both the X and Y directions.

This makes it possible to measure not only a large number of alignment marks but also the two-dimensional shape of each shot region, thus correcting the position and shape of each shot region and performing exposure.

Although FIG. 3 exemplifies a case in which the alignment marks are measured on scribe lines on every other column and every other row, this is merely one example. Scribe lines for measurement can be determined in accordance with the required alignment accuracy. If there is a portion which requires higher alignment accuracy, such as the shot regions in the peripheral portion of the substrate, the density of scribe lines for measurement may be changed in accordance with the position. The position and number of alignment marks are not limited to those shown in FIG. 4 as well.

Figure 1:
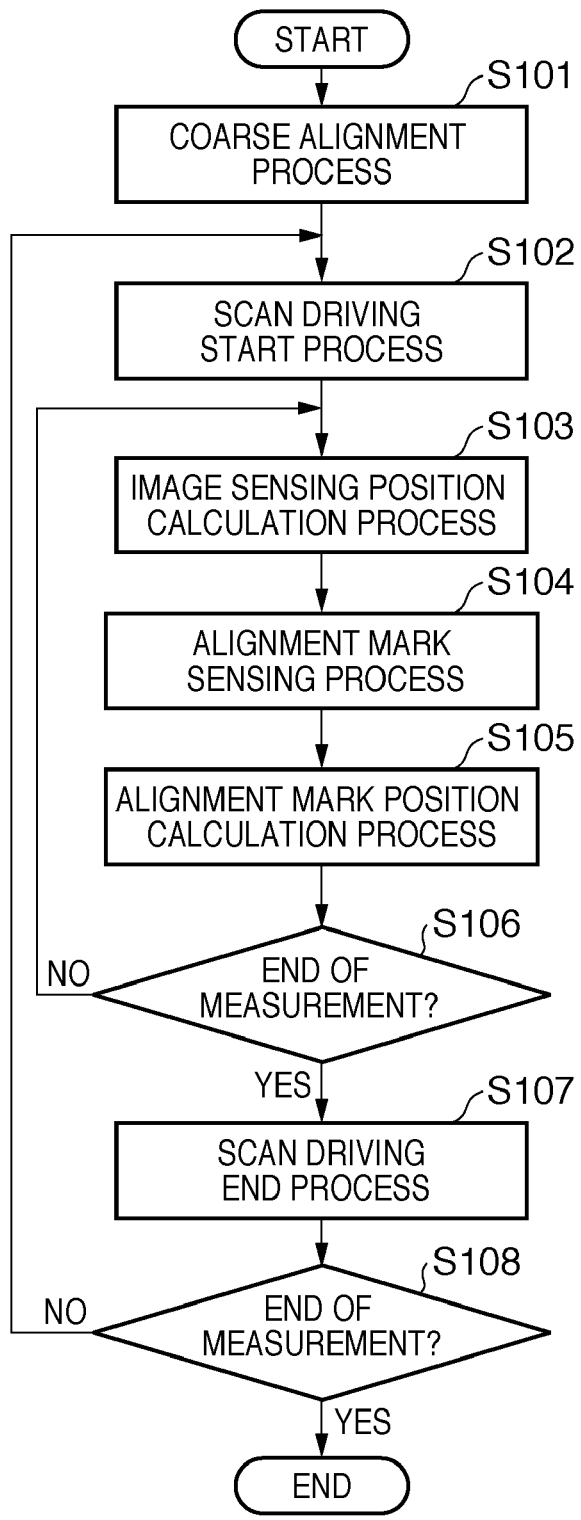
FIG. 1 is a flowchart illustrating the sequence of alignment mark measurement.
Figure 12:
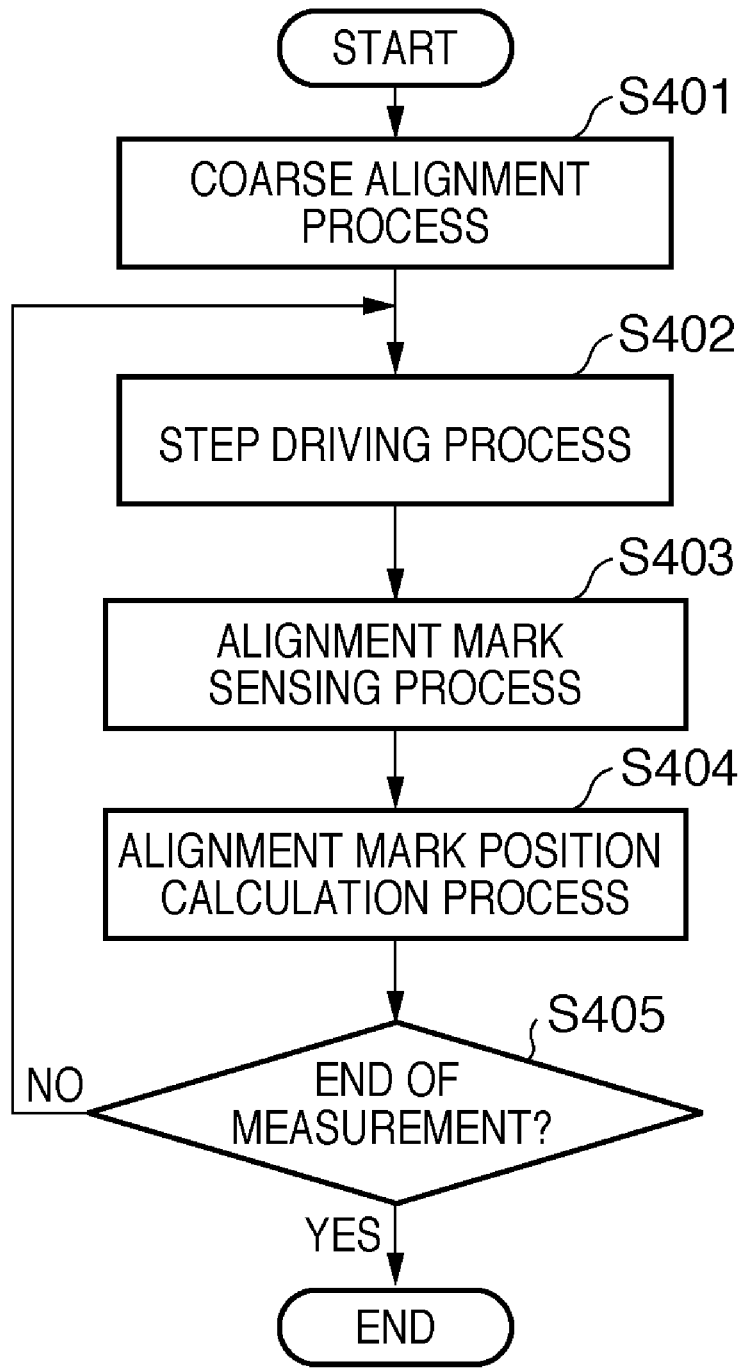
FIG. 12 is a flowchart illustrating the sequence of alignment measurement.

FIG. 1 is a flowchart illustrating the sequence of alignment mark measurement. This sequence is controlled by the controller CNT. First, step S101 is a coarse alignment process of coarsely measuring the arrangement of the shot regions. The coarse alignment process is the same as that in step S401 of FIG. 12.

In step S102, the controller CNT starts driving the substrate stage 6 in accordance with the target driving path determined such that the alignment marks on a scribe line pass through the field of the alignment detecting system 13. More specifically, the substrate stage 6 is driven so that the field of the alignment detecting system 13 moves in the directions indicated by the arrows in FIG. 3 (the substrate stage 6 moves in directions opposite to those indicated by the arrows).

In step S103, the controller CNT calculates the position of the substrate stage 6 at the moment when the alignment detecting system 13 senses the alignment mark. More specifically, the controller CNT calculates the position of the substrate stage 6 at the moment when the alignment mark enters the field of the alignment detecting system 13, based on the shot arrangement positions measured in the coarse alignment process, and the design positions of alignment marks corresponding to a preset shot region.

The position of the substrate stage 6 (substrate 5) in the Z direction while the substrate stage 6 moves along the X-Y plane will be explained herein. When the alignment mark is sensed by the alignment detecting system 13, the alignment mark needs to be aligned with the object plane (focal position) of the alignment detecting system 13. If the alignment mark is not aligned with the object plane, the contrast of an image obtained by sensing the alignment mark decreases, resulting in deterioration in the measurement accuracy. To avoid this situation, in this embodiment, the measurement value obtained by the focus detecting system 12 when the alignment mark is aligned with the object plane of the alignment detecting system 13 is stored. During the driving of the substrate stage 6, the focus detecting system 12 measures the surface position of the substrate 5 in the Z direction, and the position of the substrate stage 6 in the Z direction is always controlled so that the measurement value obtained by the focus detecting system 12 matches that stored in advance. This makes it possible to align the alignment mark with the object plane of the alignment detecting system 13 during the driving of the substrate stage 6.

In step S104, the controller CNT controls the alignment detecting system 13 to sense the alignment mark after waiting until the substrate stage 6 reaches the image sensing position calculated in step S103. The controller CNT stores the position of the substrate stage 6 in sensing the alignment mark.

In step S105, the controller CNT calculates the position of the alignment mark in the field of the alignment detecting system 13 based on the sensed alignment mark image using a known method. Next, the controller CNT calculates the position of the alignment mark on the substrate 5 based on the position of the substrate stage 6 in sensing the alignment mark, and the position of the alignment mark in the field of the alignment detecting system 13. A case in which the position of the alignment mark in the field of the alignment detecting system 13 is calculated immediately after sensing the alignment mark has been explained as one example herein. However, the position of the alignment mark may be calculated after sensing all alignment marks and storing the sensed data.

The processing in steps S103 to S105 is repeated until it is determined in step S106 that all alignment marks to be measured on one scribe line have been measured.

If it is determined in step S106 that all alignment marks to be measured on one scribe line have been measured, the controller CNT ends the scan driving of the substrate stage 6 in step S107. By the processing described above in steps S102 to S107, the alignment marks set on one scribe line have been measured.

Subsequently, the processing in steps S102 to S107 is executed for the alignment marks set on other scribe lines until it is determined in step S108 that the alignment marks on all scribe lines have been measured.

According to this embodiment, the alignment marks on scribe lines along the X and Y directions are measured while moving the substrate stage. This makes it possible to improve the measurement accuracy while reducing the time taken for measurement processing.

In the second embodiment, a focus detecting system (second detector) 12 detects the surface position of a substrate 5 in the optical-axis direction of a projection optical system 9 (Z direction), parallel to the position detection by an alignment detecting system (first detector) 13. In this specification, when one operation and another operation are executed in parallel, at least a part of the period of one operation overlaps with at least a part of the period of another operation.

Details which are not particularly referred to as the arrangement and operation of an exposure apparatus according to the second embodiment can be the same as in the first embodiment. In the following description, substrate surface position detection or measurement will also be referred to as focus detection or measurement.

Figure 5:
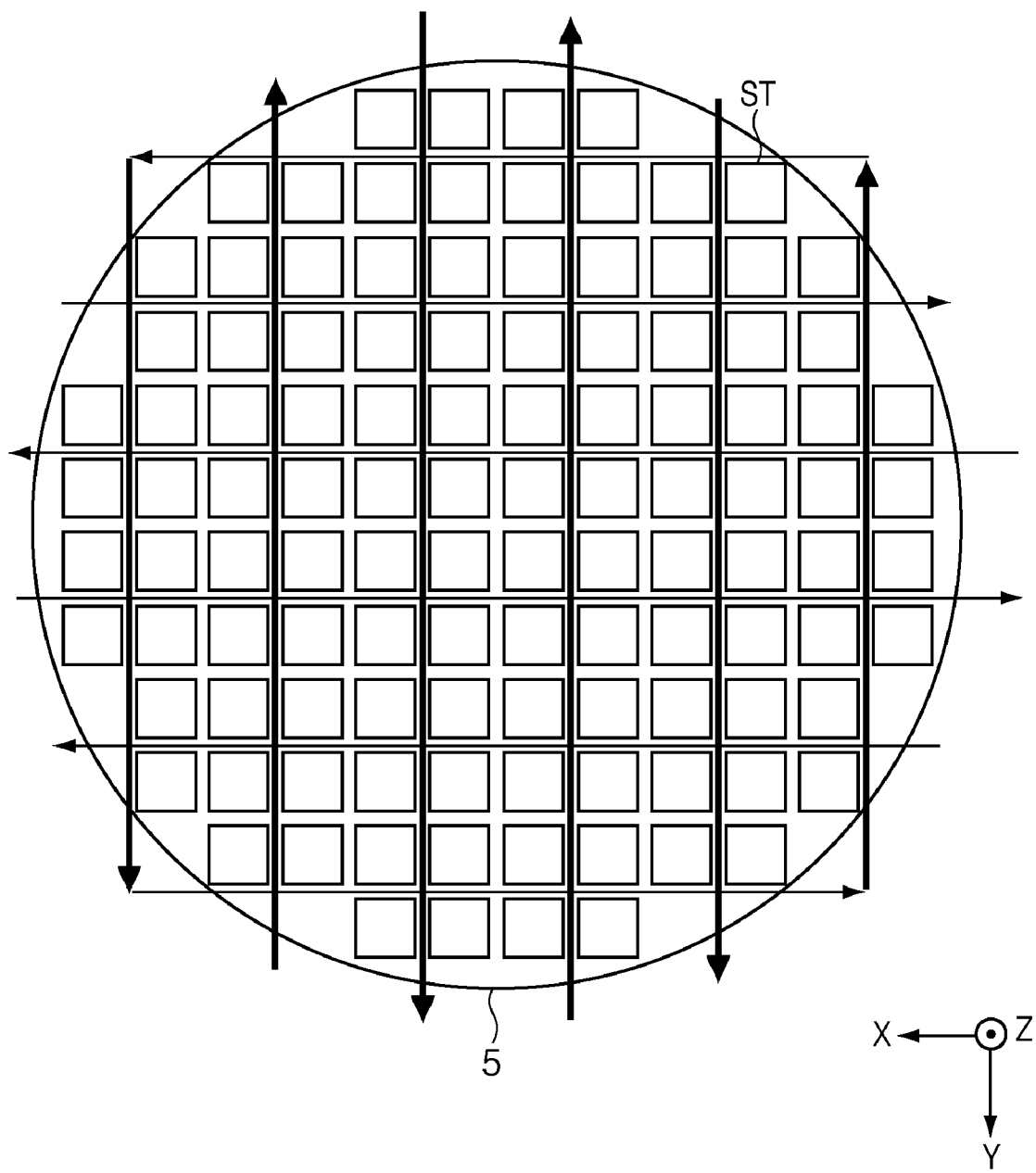
FIG. 5 is a view schematically showing a method of measuring the positions of alignment marks and the surface position of a substrate.

FIG. 5 is a view schematically showing a method of measuring the positions of alignment marks and the surface position of a substrate. Alignment mark measurement and focus measurement are executed in parallel in the process of moving a substrate stage 6 in the directions indicated by the thick arrows in FIG. 5. Only alignment mark measurement is executed in the process of moving the substrate stage 6 in the directions indicated by the thin arrows in FIG. 5. The focus detecting system 12 is configured to be able to perform focus measurement only when the substrate stage 6 moves in the directions indicated by the thick arrows (Y direction) in FIG. 5. However, the focus detecting system 12 may be configured to be able to perform focus measurement both when the substrate stage 6 moves in the X direction and when it moves in the Y direction. In this configuration, alignment mark measurement and focus measurement may be executed in parallel both when the substrate stage 6 moves in the X direction and when it moves in the Y direction.

Executing alignment mark measurement and focus measurement in parallel makes it possible to shorten the time taken to measure the substrate 5. It is also possible for the alignment detecting system 13 to execute position detection while aligning the substrate surface position with the object plane of the alignment detecting system 13 based on the detection result of the substrate surface position obtained by the focus detecting system 12.

Note that FIG. 5 schematically shows the state in which the fields of the alignment detecting system 13 and focus detecting system 12 move relative to the substrate. The substrate moves in directions opposite to those indicated by the arrows while the alignment detecting system 13 and focus detecting system 12 are fixed in position.

Figure 6:
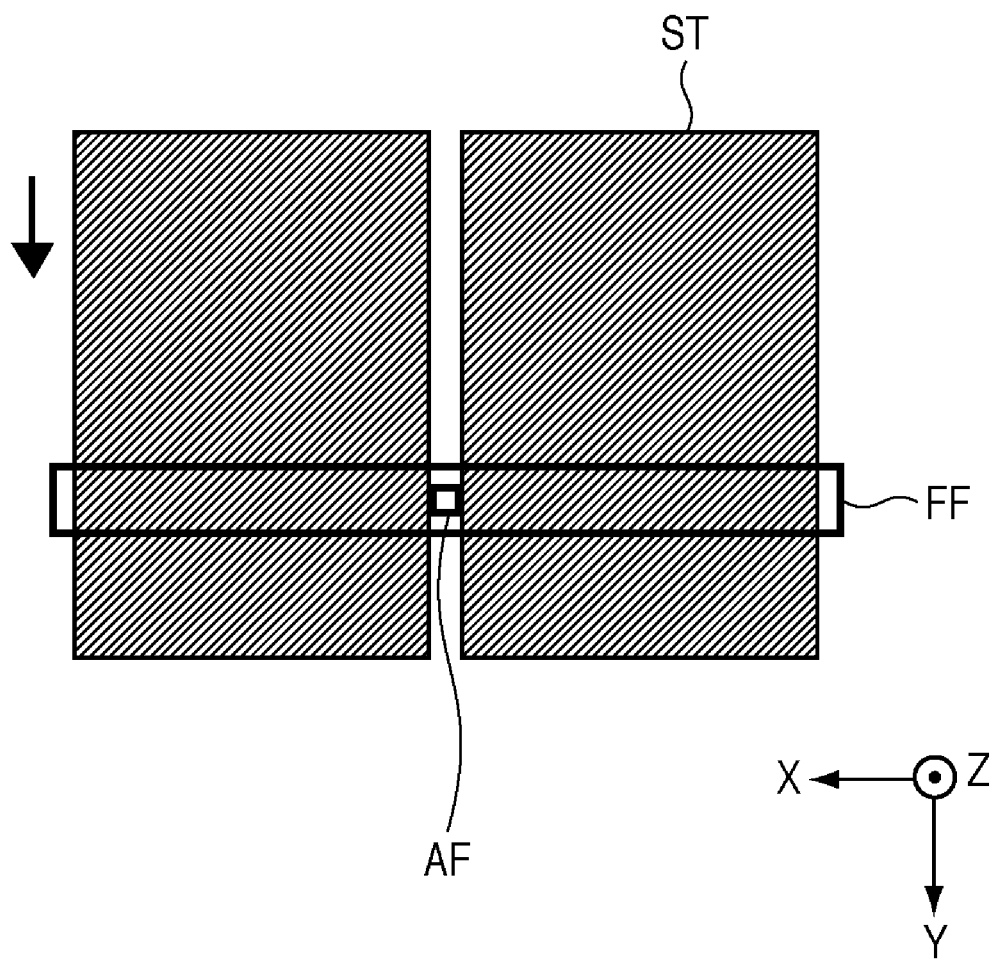
FIG. 6 is a view schematically showing the fields of an alignment detecting system and focus detecting system.

FIG. 6 is a view schematically showing the fields of the alignment detecting system 13 and focus detecting system 12. As schematically shown in FIG. 6, the center of the field of the focus detecting system 12 can be nearly identical to that of the field of the alignment detecting system 13. Also as schematically shown in FIG. 6, as a scribe line passes through a field AF of the alignment detecting system 13, the focus detecting system 12 having a field FF measures the surface positions in adjacent shot regions ST through the scribe line. The arrow in FIG. 6 indicates the substrate moving direction.

Figure 7:
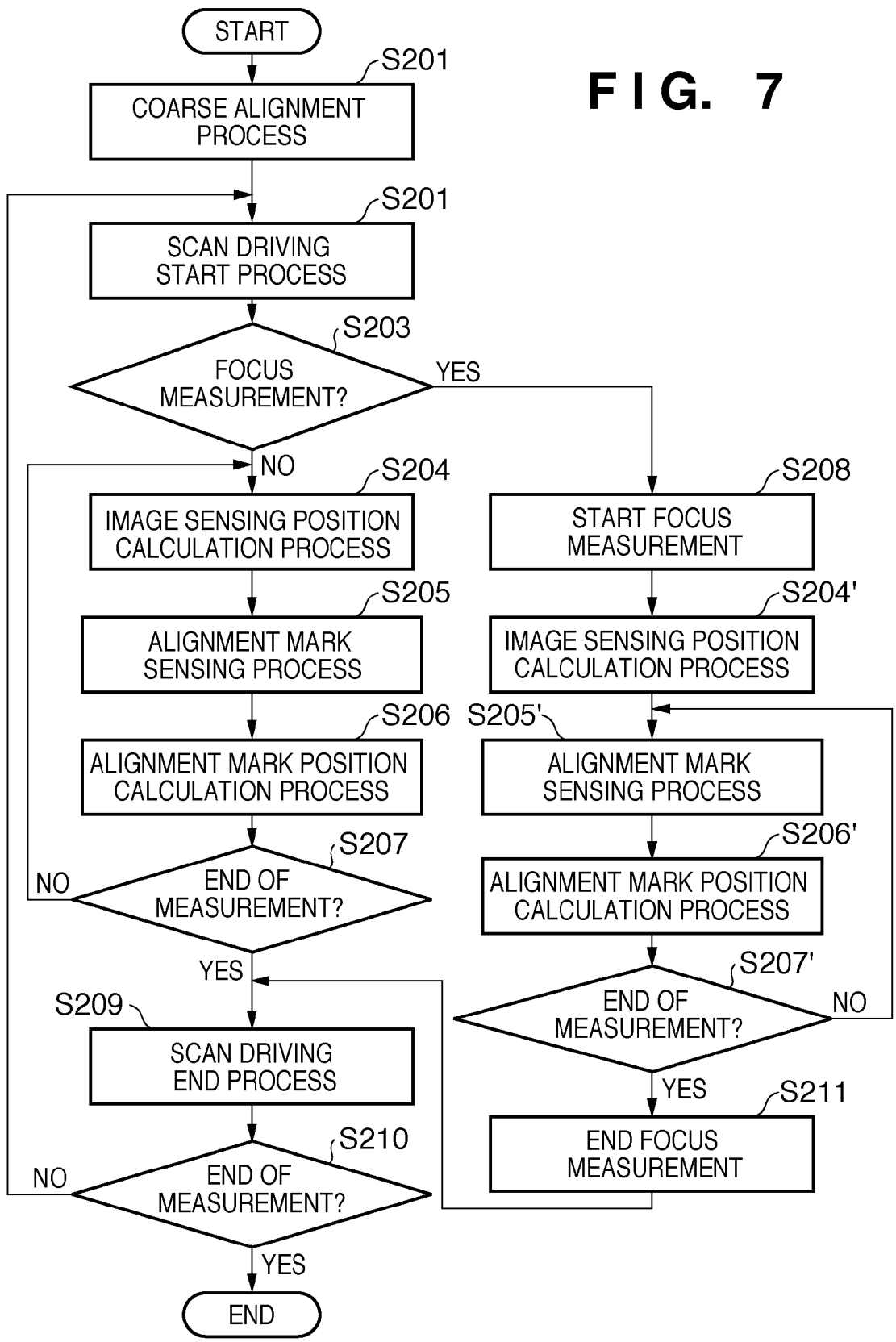
FIG. 7 is a flowchart illustrating the sequence of alignment mark measurement.

FIG. 7 is a flowchart illustrating the sequence of alignment mark measurement. This sequence is controlled by a controller CNT. First, step S201 is a coarse alignment process of coarsely measuring the arrangement of the shot regions. The coarse alignment process is the same as that in step S401 of FIG. 12.

In step S202, the controller CNT starts driving the substrate stage 6 in accordance with the target driving path determined such that the alignment marks on a scribe line pass through the field of the alignment detecting system 13. More specifically, the substrate stage 6 is driven so that the field of the alignment detecting system 13 moves in the direction indicated by the arrow in FIG. 6 (the substrate stage 6 moves in a direction opposite to that indicated by the arrow).

In step S203, the controller CNT determines whether the current driving of the substrate stage 6 is to execute only alignment measurement or simultaneously execute alignment measurement and focus measurement. If this driving is to execute only alignment measurement, the controller CNT repeats steps S204 to S207. Steps S204 to S207 are the same as steps S103 to S106 mentioned above.

If the current driving of the substrate stage 6 is to simultaneously execute alignment measurement and focus measurement, the controller CNT executes processing in steps S208, S204' to S207', and S211. In step S208, the controller CNT controls the focus detecting system 12 to start focus measurement. The processing in steps S204' to S207' subsequent to step S208 are the same as those in step S204 to S207. In step S211, the controller CNT ends the focus measurement after waiting until the substrate stage 6 reaches a position corresponding to the focus measurement end point on the current scribe line.

If it is determined in step S207 that the measurement is ended or after step S211 is executed, the controller CNT ends the scan driving of the substrate stage 6 in step S209. By the processing described above from step S202 to step S209, the measurement of the alignment marks set on one scribe line, and the focus measurement executed parallel to it are ended.

Subsequently, the above-mentioned processing is repeated by changing the target scribe line to other scribe lines until it is determined in step S210 that the alignment marks on all scribe lines have been measured.

Exposure in an exposure station 2 is performed by positioning each shot region and aligning the surface position of the shot region with the image plane of the projection optical system 9, based on the results of the above-mentioned alignment mark measurement and focus measurement in a measurement station 1.

According to this embodiment, alignment mark measurement and focus measurement are executed in parallel, thus shortening the time required for substrate measurement.

In a third embodiment, when the arranging direction of alignment marks deviates from the X and Y directions due to deformation of the arrangement of shot regions on a substrate 5, a controller CNT corrects the moving direction of a substrate stage 6 based on the arranging direction. For example, the controller CNT calculates the difference between the moving direction (target driving path) of the substrate stage 6 and the arranging direction of the shot regions based on the positions of two or more alignment marks measured immediately preceding the currently measured alignment mark, and corrects the moving direction (target driving path) of the substrate stage 6 based on the calculated difference.

Figure 8:
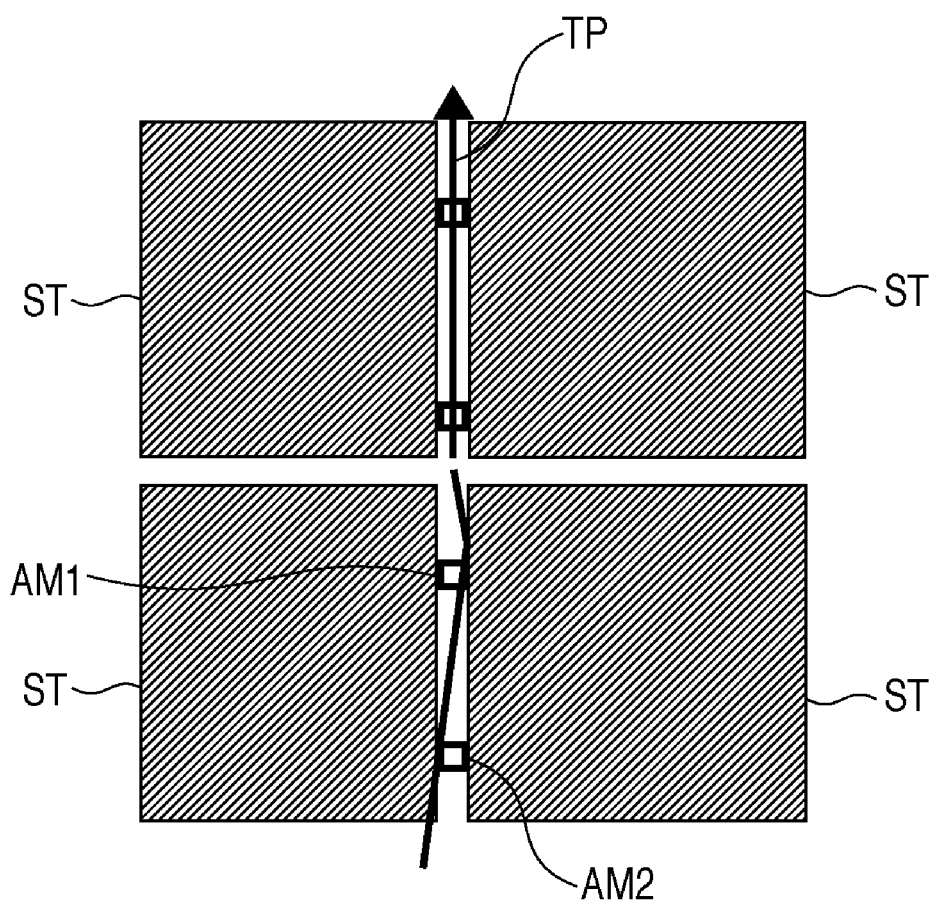
FIG. 8 is a view schematically showing correction of the target driving path of a substrate stage.

FIG. 8 is a view schematically showing the state in which the controller CNT corrects, based on the position measurement values of two alignment marks AM1 and AM2, a target driving path TP of the substrate stage 6 before measuring the next alignment mark. The arrow in FIG. 8 schematically shows the state in which the field of an alignment detecting system 13 moves relative to the substrate. In practice, the substrate, that is, the alignment marks move in a direction opposite to that indicated by the arrow relative to the field of the alignment detecting system 13 while the field of the alignment detecting system 13 is fixed in position.

This correction of the target driving path may be executed in the alignment mark measurement according to the first embodiment, or in the parallel processing of the alignment mark measurement and focus measurement according to the second embodiment.

Figure 9:
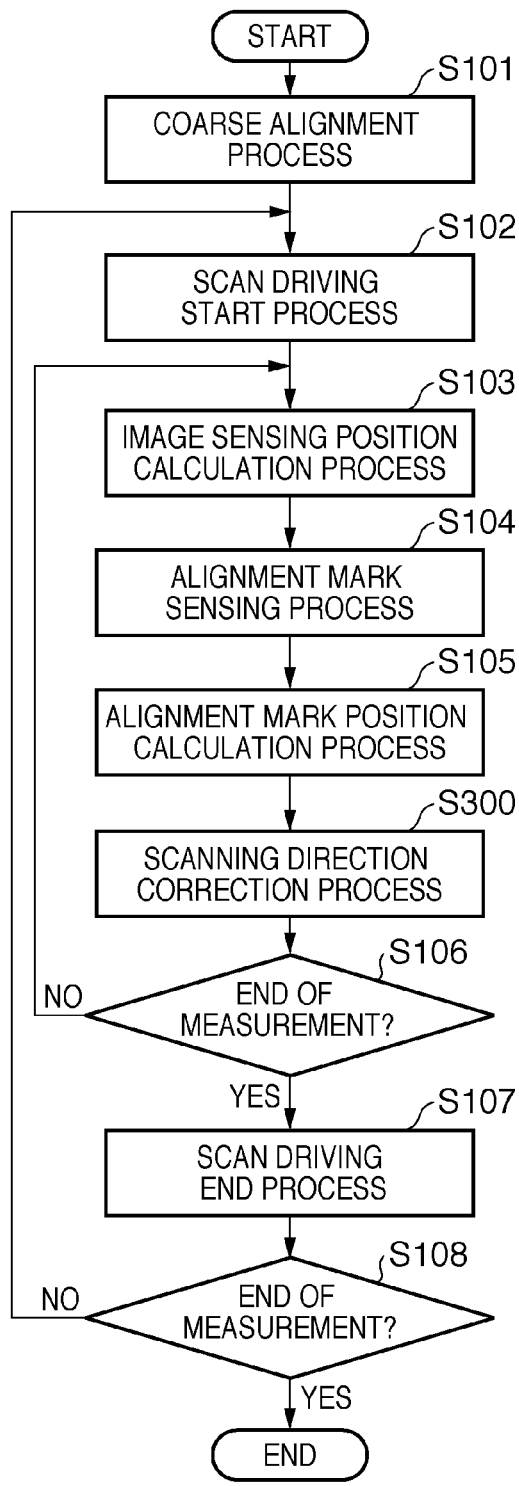
FIG. 9 is a flowchart illustrating the sequence of alignment mark measurement, including a function of correcting the target driving path.
Figure 10:
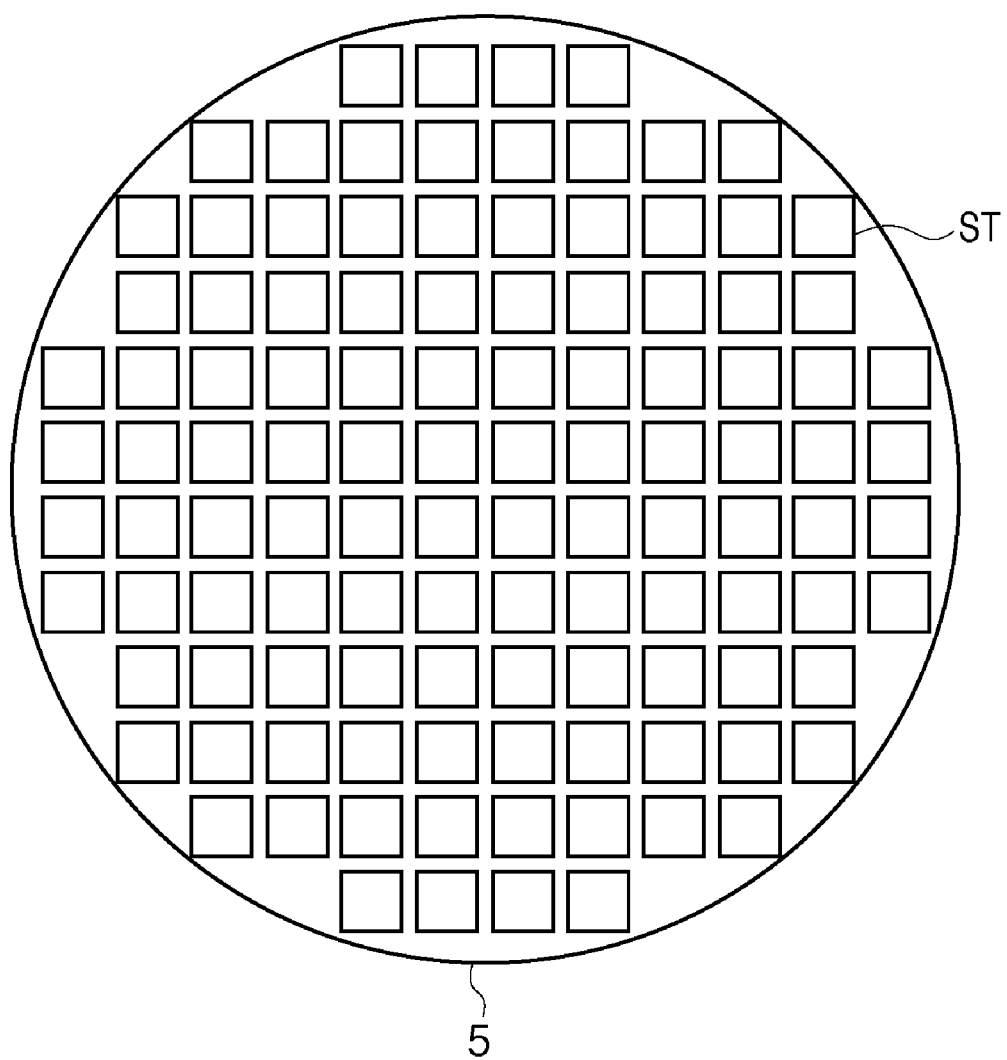
FIG. 10 is a schematic view showing an example of the shot arrangement.
Figure 11:
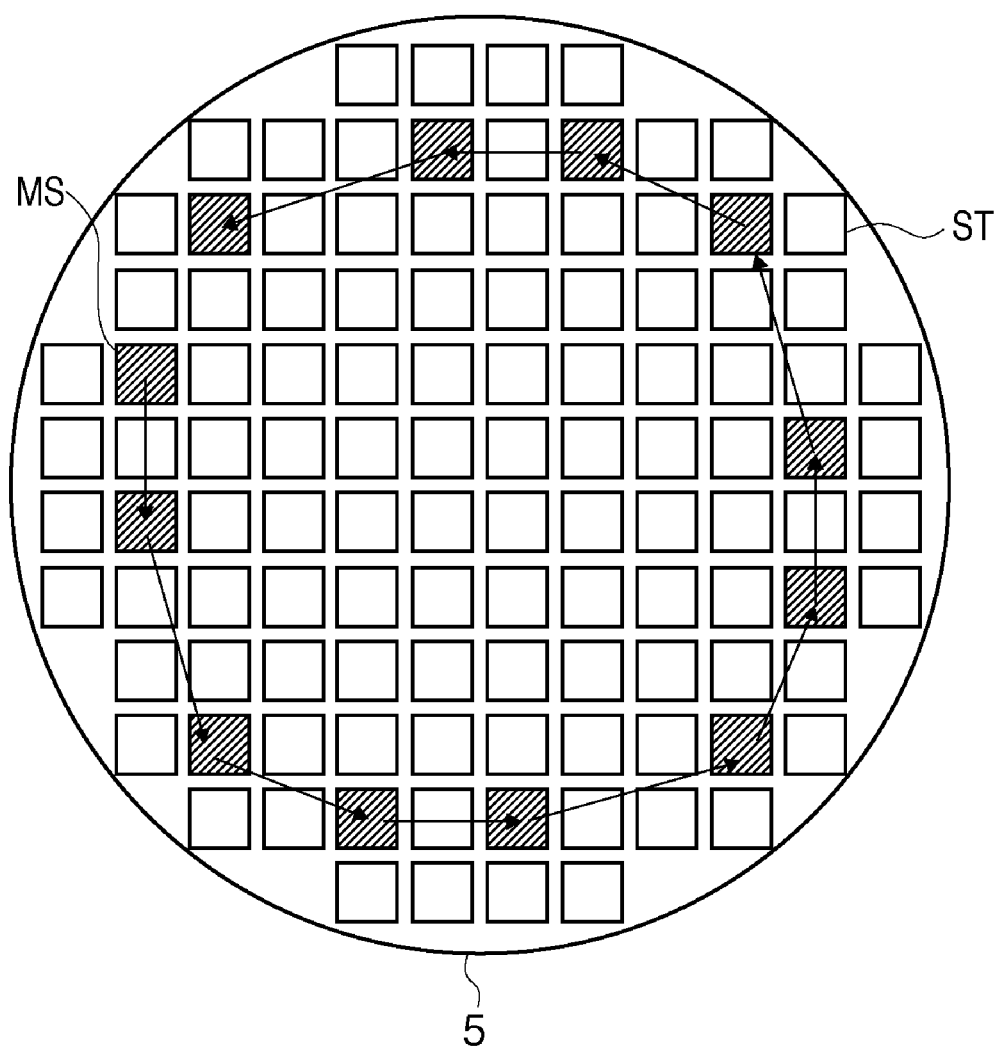
FIG. 11 is a schematic view showing an example of measurement shots.

FIG. 9 is a flowchart illustrating the sequence of processing when a function of correcting the target driving path is added to the arrangement according to the first embodiment. This processing is the one when step S300 is added between steps S105 and S106 in the sequence shown in FIG. 1.

In step S306, the controller CNT calculates the difference between the moving direction (target driving path TP) of the substrate stage 6 and the arranging direction of the shot regions based on the position of an alignment mark image (for example, corresponding to the alignment mark AM1 shown in FIG. 8) calculated in immediately preceding step S105, and the position of an alignment mark image (for example, corresponding to the alignment mark AM2 shown in FIG. 8) calculated in previous step S305. The controller CNT corrects the moving direction (target driving path TP) of the substrate stage 6 if the difference between the moving direction and the arranging direction of the shot regions exceeds an allowance value.

A device manufacturing method according to the various embodiments of the present invention is suitable for the manufacture of devices (e.g., a semiconductor device and liquid crystal device). This method can include a step of exposing a substrate coated with a photoresist to light by using the above exposure apparatus, and a step of developing the substrate exposed in the exposing step. In addition to the above steps, the device manufacturing method can include other known steps (e.g., oxidation, film forming, evaporation, doping, planarization, etching, resist removing, dicing, bodding, and packaging steps).

While the present invention has been described with reference to the various embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2008-037944, filed Feb. 19, 2008, which is hereby incorporated by reference herein in its entirety.

What is claimed is:

1. An exposure apparatus which projects a pattern of an original onto a substrate using a projection optical system, the apparatus comprising:
   a substrate stage configured to hold the substrate;
   a detector configured to detect positions of marks on the substrate in a first direction and a second direction orthogonal to each other in a plane perpendicular to an optical-axis direction of the projection optical system; and
   a controller configured to control the detector to detect the position of a mark on the substrate while moving the substrate stage substantially along the first direction, and control the detector to detect the position of a mark on the substrate while moving the substrate stage substantially along the second direction, thereby controlling positioning and exposure of the substrate based on the detection results obtained by the detector, wherein the detector includes an image sensor, and the detector is configured to sense the mark on the substrate by the image sensor when the substrate stage is moving and to detect the position of the mark based on the sensed image.

2. The apparatus according to claim 1, wherein the controller is configured to move the substrate stage, after the detector detects a first mark on the substrate, such that the detector detects a second mark on the substrate, to calculate a difference between a moving direction of the substrate stage and an arranging direction of shot regions on the substrate, and to correct the moving direction of the substrate stage based on the calculated difference.

3. A device manufacturing method comprising:

exposing a substrate using an exposure apparatus; and developing the substrate, wherein the exposure apparatus is configured to project a pattern of an original onto a substrate using a projection optical system, thereby exposing the substrate, and comprises:

a substrate stage configured to hold the substrate;

a detector configured to detect positions of marks on the substrate in a first direction and a second direction orthogonal to each other in a plane perpendicular to an optical-axis direction of the projection optical system; and a controller configured to control the detector to detect the position of a mark on the substrate while moving the substrate stage substantially along the first direction, and control the detector to detect the position of a mark on the substrate while moving the substrate stage substantially along the second direction, thereby controlling positioning and exposure of the substrate based on the detection results obtained by the detector, wherein the detector includes an image sensor, and the detector is configured to sense the mark on the substrate by the image sensor when the substrate stage is moving and to detect the position of the mark based on the sensed image.

* * * * *